US011959975B2

(12) United States Patent
Hartmann

(10) Patent No.: US 11,959,975 B2
(45) Date of Patent: Apr. 16, 2024

(54) METHOD AND MONITORING DEVICE FOR DETERMINING A PARTIAL INSULATION RESISTANCE AND A PARTIAL SYSTEM LEAKAGE CAPACITANCE IN A BRANCHED UNGROUNDED POWER SUPPLY SYSTEM

(71) Applicant: Bender GmbH & Co. KG, Gruenberg (DE)

(72) Inventor: Carsten Hartmann, Schotten (DE)

(73) Assignee: BENDER GMBH & CO. KG, Gruenberg (DE)

( * ) Notice: Subject to any disclaimer, the term of this patent is extended or adjusted under 35 U.S.C. 154(b) by 0 days.

(21) Appl. No.: 18/122,312

(22) Filed: Mar. 16, 2023

(65) Prior Publication Data

US 2023/0296691 A1    Sep. 21, 2023

(30) Foreign Application Priority Data

Mar. 18, 2022    (DE) ...................... 10 2022 106 394.1

(51) Int. Cl.
*G01R 31/52*    (2020.01)
*G01R 27/18*    (2006.01)
(Continued)

(52) U.S. Cl.
CPC ............. *G01R 31/52* (2020.01); *G01R 27/18* (2013.01); *G01R 27/2605* (2013.01); *G01R 31/08* (2013.01)

(58) Field of Classification Search
CPC ...... G01R 27/00; G01R 27/02; G01R 27/025; G01R 27/16; G01R 27/18; G01R 27/26;
(Continued)

(56) References Cited

U.S. PATENT DOCUMENTS 9,632,131 B2 *   4/2017   Broeckmann .......... G01R 27/18
10,340,680 B2    7/2019   Hackl
(Continued)

FOREIGN PATENT DOCUMENTS

DE   102014201044 B3    3/2015
DE   102017209663 B3   10/2018
(Continued)

*Primary Examiner* — Hoai-An D. Nguyen
(74) *Attorney, Agent, or Firm* — Dickinson Wright PLLC; Andrew D. Dorisio

(57) ABSTRACT

A method and monitoring device for selectively determining partial insulation resistance and partial system leakage capacitance of an outgoing line in a branched ungrounded power supply system monitored using an insulation monitoring device actively superposing a measuring alternating voltage on the ungrounded power supply system. Using an equivalent circuit diagram of the branched ungrounded power supply system as a basis, the partial insulation resistance having the current/voltage ratios applicable in linear systems are derived from the known measuring voltage and the inner resistance of the insulation monitoring device and from the total insulation resistance and the stationary partial current measured in the corresponding outgoing line and in the settled state. To calculate the partial system leakage capacitance, the temporal derivative of the measured non-stationary conductor-to-ground voltage is evaluated in conjunction with the non-stationary partial current and the previously determined partial insulation resistance.

6 Claims, 3 Drawing Sheets

(51) Int. Cl.
*G01R 27/26* (2006.01)
*G01R 31/08* (2020.01)

(58) Field of Classification Search
CPC .... G01R 27/2605; G01R 31/00; G01R 31/01; G01R 31/013; G01R 31/016; G01R 31/08; G01R 31/50; G01R 31/52
USPC ........................................ 324/600, 649, 691
See application file for complete search history.

(56) References Cited

U.S. PATENT DOCUMENTS

| | | | |
|---|---|---|---|
| 10,598,720 B2 * | 3/2020 | Schaefer | G01R 27/18 |
| 11,002,776 B2 * | 5/2021 | Hackl | G01R 27/025 |
| 11,156,653 B2 * | 10/2021 | Erk | H02H 3/17 |
| 11,275,102 B2 * | 3/2022 | Broeckmann | G01R 27/205 |
| 11,353,486 B2 * | 6/2022 | Schaefer | G01R 31/52 |
| 11,705,715 B2 * | 7/2023 | Hackl | G01R 31/1272 |
| | | | 361/91.1 |

FOREIGN PATENT DOCUMENTS

| | | |
|---|---|---|
| DE | 102017217473 B3 | 1/2019 |
| DE | 102020114906 A1 | 12/2021 |
| EP | 3620800 A1 | 3/2020 |

\* cited by examiner

METHOD AND MONITORING DEVICE FOR DETERMINING A PARTIAL INSULATION RESISTANCE AND A PARTIAL SYSTEM LEAKAGE CAPACITANCE IN A BRANCHED UNGROUNDED POWER SUPPLY SYSTEM

CROSS-REFERENCE TO RELATED APPLICATION

This application claims priority to German Patent Application No. 10 2022 106 394.1 filed on Mar. 18, 2022, the disclosure of which is incorporated herein by reference.

TECHNICAL FIELD

The present disclosure relates to a method and a monitoring device for selectively determining a partial insulation resistance and a partial system leakage capacitance of an outgoing line in a branched ungrounded power supply system which is monitored using an insulation monitoring device which actively superposes a measuring alternating voltage, in particular a square pulse measuring voltage, on the ungrounded power supply system.

BACKGROUND

For the supply of electrical equipment, the network form of an ungrounded power supply system is used when higher demands are made to the operational, fire and touch safety.

In this network form of an ungrounded power supply system, which is also referred to as an insulated network (French: isolé terre—IT) or IT system, the active parts are separated from the ground potential—to ground. The advantage of these networks is that the operation of the power supply system can be continued, i.e., the function of the electrical equipment is not impaired, when a first insulation fault, such as a ground fault or a touch fault, occurs since an electric circuit cannot become closed in this first fault instance owing to the ideally infinitely large impedance value between the active conductors (outer conductors/phase conductors and, if included, the neutral conductor N) of the network and ground.

The electric resistance of the ungrounded power supply system to ground (insulation resistance) is therefore constantly monitored, as a fault loop would arise because of a possible other fault at a different active conductor (second fault) and the flowing fault current in conjunction with an overcurrent protective device would cause the electric installation to be shut down, resulting in an operational standstill.

The ungrounded power supply system is monitored according to standard IEC 61557-8 using an insulation monitoring device which is coupled between at least one of the active conductors of the ungrounded power supply system and ground. For this purpose, the standardized insulation monitoring device has a measuring voltage source which actively superposes a measuring voltage on the power supply system between the active conductor(s) and ground. According to the state of the art, a measuring alternating voltage is used as a measuring voltage, and a square pulse measuring voltage (pulse measuring method) is used in particular as a specific form of the measuring alternating voltage. A deterioration of the insulation state is reflected by the increasing measuring current driven by the measuring voltage. The insulation state is detected in the insulation monitoring device, is indicated and can be transmitted to other monitoring units. When a certain threshold value is not met, an alarm notification is emitted.

Besides monitoring the insulation resistance, increased significance is also laid on testing the system leakage capacitances, as the electric installation, in particular the grounding conductor of the connected electrical equipment, carries additional load because of the capacitive leakage currents of the system leakage capacitances. Moreover, the sum of the system leakage capacitances can change as a consequence of different operational conditions. In order to identify fault sources and preclude possible overloads, monitoring the system leakage capacitances appears advantageous.

However, the monitoring of the insulation resistance and the system leakage capacitance of the entire electric installation—of the ungrounded power supply system including the consumers connected thereto—i.e., the total insulation resistance and the total system leakage capacitance, does not allow concluding in which outgoing line of the branched ungrounded power supply system the corresponding partial insulation resistance has not met a reliable threshold value or which corresponding partial system leakage capacitance has exceeded a threshold value.

According to the state of the art, an insulation fault location is initiated for identifying the faulty outgoing line in the branched ungrounded power supply system after the insulation monitoring device has indicated a first fault.

An insulation fault location device essentially comprises a test current generator and several test current sensors which are disposed in the outgoing line, are commonly configured as measuring current transformers and are connected to an evaluation apparatus for evaluating the measuring signals.

The corresponding test current flowing in the outgoing line is registered by all measuring current transformers in the test current circuit (fault current circuit) and evaluated and indicated in the evaluation apparatus. By assigning the measuring current transformers to the outgoing lines as known, the fault can be located.

In order to be able to predictively identify a critical outgoing line and to thus forestall a possible shut-down of the entire electric installation should a second fault occur, the selective determination of a partial insulation resistance effective only in the possibly critical outgoing line and of a partial system leakage capacitance effective in this outgoing line is necessary.

Specification DE 10 2017 217 473 B3 discloses a method for selectively determining a partial insulation resistance and a partial system leakage capacitance. The partial insulation resistance and the partial system leakage capacitance are determined there by means of test current supplied by an enhanced insulation fault location device. A disadvantage is that this test current has to be supplied in addition to the measuring current of an insulation monitoring system or that the measuring current generator of the insulation monitoring system has to be configured so as to be switchable between changing operating modes, i.e., measuring current/test current.

SUMMARY

An aspect of the present disclosure is a method and a device for selectively determining a partial insulation resistance and a partial system leakage capacitance of an outgoing line in a branched ungrounded power supply system, the method being efficiently implementable from a circuitry point of view and the device being able to be retrofitted to supplement existing monitoring devices.

With regard to a method for selectively determining partial insulation resistance Rx of an outgoing line, the object is attained by calculating partial insulation resistance Rx according to Rx=Ue/Ixstat with a stationary conductor-to-ground voltage Ue dropping via the outgoing line and a stationary partial current Ixstat measured in the outgoing line and in a settled state, wherein Ue=Iges*Rfges applies to stationary conductor-to-ground voltage Ue, with a total insulation resistance Rfges transmitted by the insulation monitoring device and a total measuring current Iges driven by known square pulse measuring voltage Uq, wherein total measuring current Iges is calculated from Iges=Uq/(Rfges+Ri) having known inner resistance Ri of the insulation monitoring device, meaning partial insulation resistance Rx is calculated from Rx=(Rfges*Uq)/((Rfges+Ri)*Ixstat).

Starting point for calculating partial insulation resistance Rx is Ohm's law, according to which partial insulation resistance Rx of a determined outgoing line is yielded from stationary conductor-to-ground voltage Ue dropping via this outgoing line and from stationary partial current Ixstat measured in this outgoing line. Both parameters, i.e., stationary conductor-to-ground voltage Ue and stationary partial current Ixstat, are viewed in the settled state once the transient actions have decayed.

Total measuring current Iges driven by known square pulse measuring voltage Uq of the insulation monitoring device is calculated using total insulation resistance Rfges transmitted by the—presumably installed—insulation monitoring device and known inner resistance Ri of the insulation monitoring device.

A loop (Kirchhoff's second law, see FIG. 3) yields that stationary conductor-to-ground voltage Ue can be expressed by total insulation resistance Rfges and total measuring current Iges and that total measuring current Iges is further traced back to known parameters square pulse measuring voltage Uq and inner resistance Ri of the insulation monitoring device.

A measurement of total measuring current Iges and stationary conductor-to-ground voltage Ue is not required. Instead, partial insulation resistance Rx is advantageously yielded from the known variables square pulse measuring voltage Uq and inner resistance Ri of the insulation monitoring device and from total insulation resistance Rfges, standardly calculated and transmitted by the insulation monitoring device, and stationary partial current Ixstat measured in the corresponding outgoing line and in the settled state.

With regard to a method for selectively determining partial system leakage capacity Cx of an outgoing line, the object is attained by detecting a partial insulation resistance Rx of the outgoing line, calculating partial system leakage capacitance Cx according to Cx=ic(t)/(due(t)/dt), with a leakage current ic(t) flowing via partial system leakage capacitance Cx and a temporal sequence of measured non-stationary conductor-to-ground voltage ue(t) which drops via the outgoing line and whose temporal derivative is due(t)/dt, leakage current ic(t) being calculated from ic(t)= ix(t)−ue(t)/Rx having a temporal sequence of non-stationary partial current ix(t) measured in the outgoing line and detected partial insulation resistance Rx, meaning partial system leakage capacitance Cx is calculated from Cx=(ix(t)−(ue(t)/Rx))/(due(t)/dt).

The calculation of partial system leakage capacitance Cx is based on the basic physical realization that the temporal sequence of leakage current ic(t) flowing via partial system leakage capacitance Cx is dependent on the temporal change (d/dt) of measured non-stationary conductor-to-ground voltage ue(t) dropping via partial system leakage capacitance Cx.

On the other hand, according to Kirchhoff's current law (Kirchhoff's first law), leakage current ic(t) flowing via partial system leakage capacitance Cx is yielded from the difference between non-stationary partial current ix(t) measured in the outgoing line and the ohmic current portion flowing via partial insulation resistance Rx. Using previously detected partial insulation resistance Rx, measured non-stationary partial current ix(t) and measured non-stationary conductor-to-ground voltage ue(t) and their temporal derivative due(t)/dt, partial system leakage capacitance Cx can be calculated as Cx=(ix(t)−(ue(t)/Rx))/(due(t)/dt).

In reference to a device, the object is attained by an AC/DC measuring current transformer for measuring a stationary partial current Ixstat and a non-stationary partial current ix(t) in each outgoing line to be tested, a voltage measuring device which is switched between an active conductor of the ungrounded power supply system and ground for measuring the temporal sequence of non-stationary conductor-to-ground voltage ue(t), and an evaluation unit which is connected to the AC/DC measuring current transformer and to the insulation monitoring device and is configured for calculating partial insulation resistance Rx and partial system leakage capacitance Cx.

The previously described methods for selectively determining partial insulation resistance Rx and partial system leakage capacitance Cx are implemented by means of a monitoring device which according to the invention has an AC/DC (type B) measuring current transformer in each outgoing line, a voltage measuring device and an evaluation unit in addition to a known, standardized insulation monitoring device which is configured to actively superpose a measuring alternating voltage Um on the power supply system.

The corresponding AC/DC measuring current transformers measure stationary partial current Ixstat in each outgoing line to be tested for determining partial insulation resistance Rx in the settled state and the temporal sequence of non-stationary partial current ix(t) for determining partial system leakage capacitance Cx.

The voltage measuring device registers the temporal sequence of non-stationary conductor-to-ground ue(t) between an active conductor and ground.

The evaluation unit is connected to the insulation monitoring device via a communications line for transmitting total insulation resistance Rfges provided by the insulation monitoring device and is connected to the AC/DC measuring current transformers via signal lines. All calculation processes take place in the evaluation unit.

Advantageously, the insulation monitoring device is configured to superpose a square pulse measuring voltage Uq as a measuring alternating voltage on the power supply system in order to calculate partial insulation resistance Rx.

In order to register stationary current Ixstat, the insulation monitoring device superposes measuring alternating voltage Um in the form of a square pulse measuring voltage Uq. The duration of the individual square pulses is sufficiently long, meaning a settled (stationary) state arises, in which (purely ohmic) stationary current Ixstat is registrable, following a transient phase, in which the system leakage capacitances are charged/uncharged.

In another embodiment, the measuring current transformers are installed measuring current transformers of an insulation fault location device.

Since a plurality of the installed ungrounded power supply systems are already equipped with an insulation fault location device which has measuring current transformers disposed on the outgoing lines, it is advantageous to design these measuring current transformers as AC/DC devices and to use them for registering stationary partial current Ixstat flowing in the corresponding outgoing line and non-stationary partial current ix(t) in order to be able to determine the corresponding partial insulation resistance Rx and the corresponding partial system leakage capacitance Cx.

Advantageously, the evaluation unit is an evaluation apparatus of the insulation fault location device.

Like the measuring current transformer, an evaluation apparatus of the insulation fault location device already available in the ungrounded power supply system can be used to determine partial insulation resistance Rx and partial system leakage capacitance Cx.

Partial insulation resistance Rx and partial system leakage capacitance Cx can be monitored continuously according to the invention without present monitoring systems having to be shut down or switched or whose operating modes need be changed. Hence, it is not necessary for the installed insulation monitoring device to transition from the operating mode insulation monitoring (measuring-current supply for determining the total insulation resistance) to operating mode insulation fault location (test-current supply for determining the faulty outgoing line). An available standardized insulation monitoring device can function independently of the monitoring apparatus according to the invention, albeit advantageously enhanced in its functionality by the invention.

BRIEF DESCRIPTION OF THE DRAWINGS

Further advantageous embodiment features are derived from the following description and the drawings which describe a preferred embodiment of the invention by means of examples.

DETAILED DESCRIPTION

Figure 1:
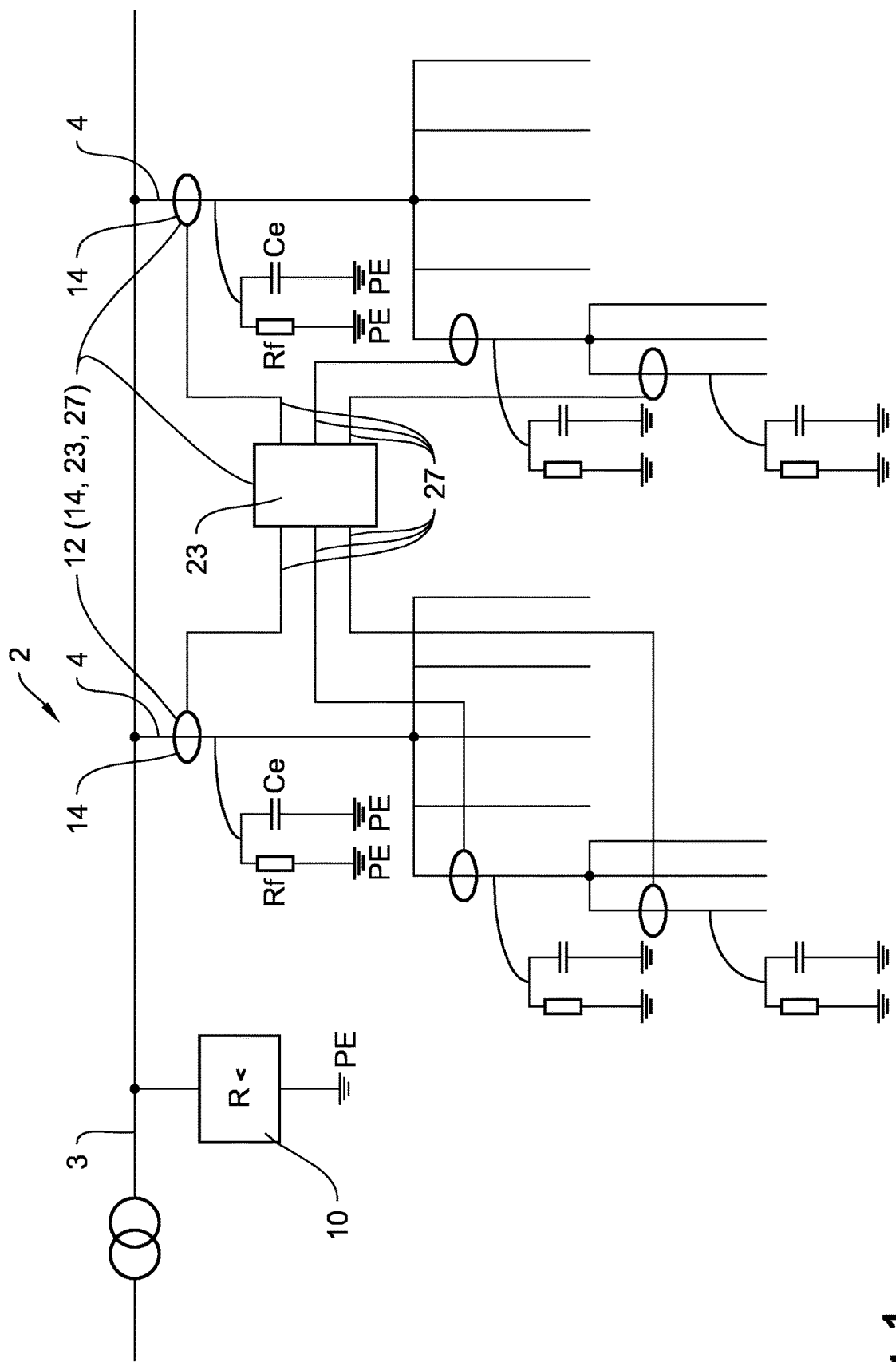
FIG. 1 shows a branched ungrounded power supply system having insulation monitoring and an insulation fault location device.

FIG. 1 exemplarily shows the topology of a branched ungrounded power supply system 2. Ungrounded power supply system 2 has several outgoing lines 4 branching off of a main supply 3. Each outgoing line 4 and the other branches branching off of this outgoing line have (partial) insulation resistances Rf and (partial) system leakage capacitances Cf to ground; for portrayal reasons, insulation resistances Rf and system leakage capacitances Ce are only shown for the first level of the outgoing lines.

For insulation monitoring, a standardized insulation monitoring device 10 is provided which actively superposes a measuring voltage on branched ungrounded power supply system 2. The settling measuring current circuit via the active conductor of ungrounded power supply system 2, via insulation resistances Rf and system leakage capacitances Ce and ground back to insulation monitoring device 10 is evaluated in insulation monitoring device 10 and provides a statement on the parameter of the (total) insulation resistance of the electric installation.

If the insulation resistance does not meet a certain threshold value, an alarm signal is emitted and an insulation fault location is initiated by means of an insulation fault location device 12 in order to identify the outgoing line. For this purpose, insulation fault location device 12 comprises measuring current transformers 14 which are disposed in each outgoing line 4 to be monitored and whose measuring signals are forwarded to an evaluation apparatus 23 in insulation fault location device 12 via signal lines 27.

Figure 2:
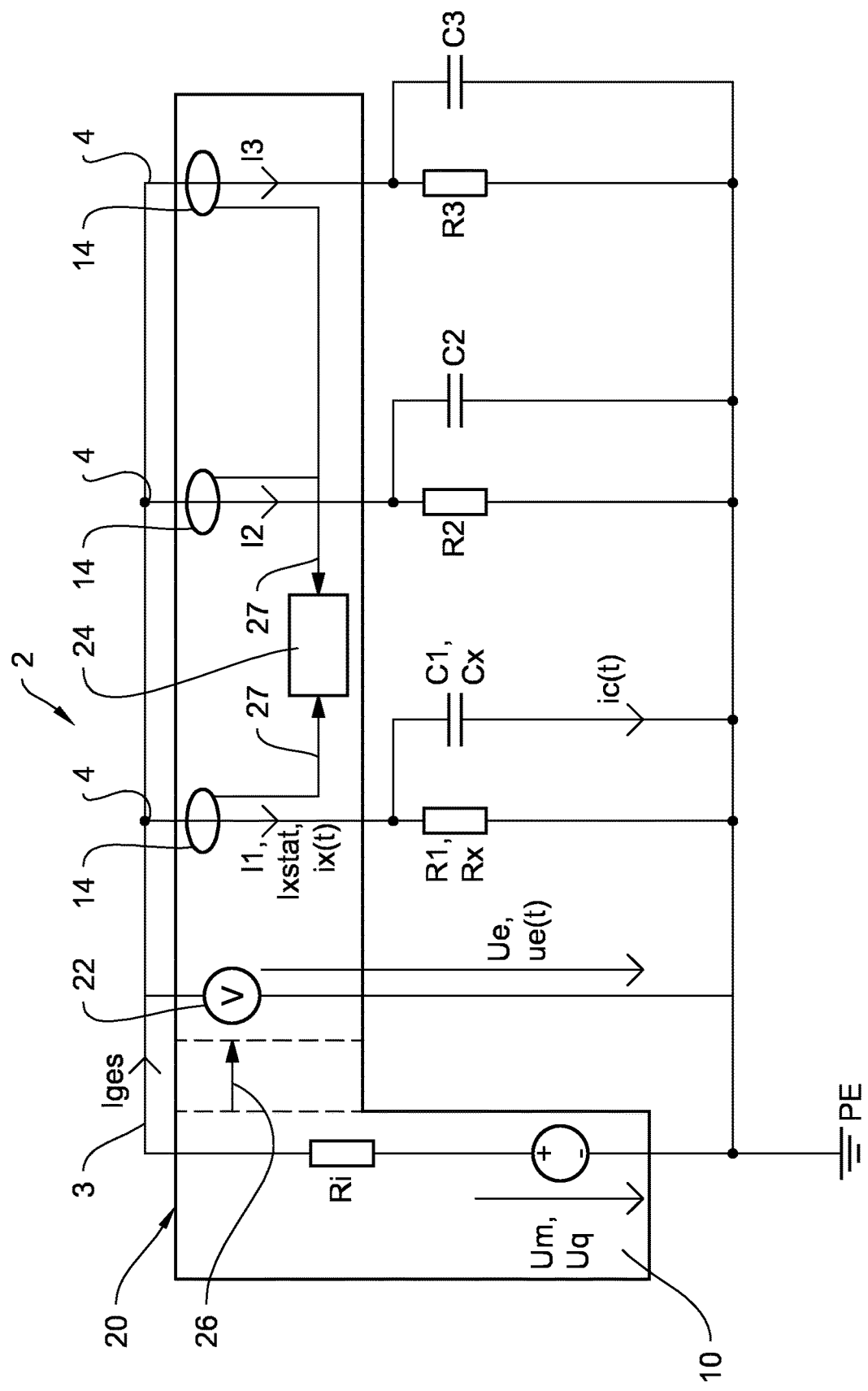
FIG. 2 shows an equivalent circuit diagram of the branched ungrounded power supply system having a monitoring device according to the invention.

FIG. 2 shows an equivalent circuit diagram of branched ungrounded power supply system 2 having a monitoring device 20 according to the invention.

Power supply system 2 forms an application environment (not part of the invention) for monitoring device 20 according to the invention and comprises main supply 3 and exemplarily having three outgoing lines 4.

Outgoing lines 4 have partial insulation resistances R1, R2 and R3, each to ground PE, and partial system leakage capacitances C1, C2 and C3.

Monitoring device 20 according to the invention consists of insulation monitoring device 10, which is connected to an evaluation unit 24 of monitoring device 20 via a communications line 26, corresponding AC/DC measuring current transformers 14, which are disposed in outgoing lines 4 and are connected to evaluation unit 24 via signal lines 27, and voltage measuring device 22.

Insulation monitoring device 10 superposes a measuring alternating voltage Um on power supply system 2 at a feeding point of main supply 3, measuring alternating voltage Um driving a total measuring current Iges (in the case of calculating partial insulation resistance Rx in the signal form of square pulse measuring voltage Uq), which is divided into partial currents I1, I2 and I3 flowing via outgoing lines 4.

The parameters Ixstat, ix(t), Rx, Cx and ic(t) required for the calculation and/or to be determined are assigned to first outgoing line 4 in an exemplary manner.

To calculate partial insulation resistance Rx, stationary partial current Ixstat is first measured in the settled state using AC/DC measuring current transformer 14 after the recharging processes of partial system leakage capacitances Cx are concluded. Partial insulation resistance Rx together with the parameters known by insulation monitoring device 10 square pulse measuring voltage Uq and inner resistance Ri and total insulation resistance Rfges transmitted by insulation monitoring device 10 is detected by evaluation unit 24.

Via observed outgoing line 4 and consequently via partial system leakage capacitances Cx to be detected, the temporal sequence of non-stationary conductor-to-ground voltage ue(t) is measured by means of voltage measuring device 22. Together with the (ohmic) current portion flowing via partial insulation resistance Rx, (capacitive) leakage current ic(t) flowing via partial system leakage capacitance Cx forms the temporal sequence of non-stationary partial current ix(t) measured by measuring current transformer 14 during the settling process. Since partial insulation resistance Rx (previously detected) and ix(t) and ue(t) (currently measured) are thus known, leakage current ic(t) can be calculated. In conjunction with forming the temporal derivative of non-stationary conductor-to-ground voltage ue(t), searched-for partial system leakage capacitance Cx is thus derived.

Figure 3:
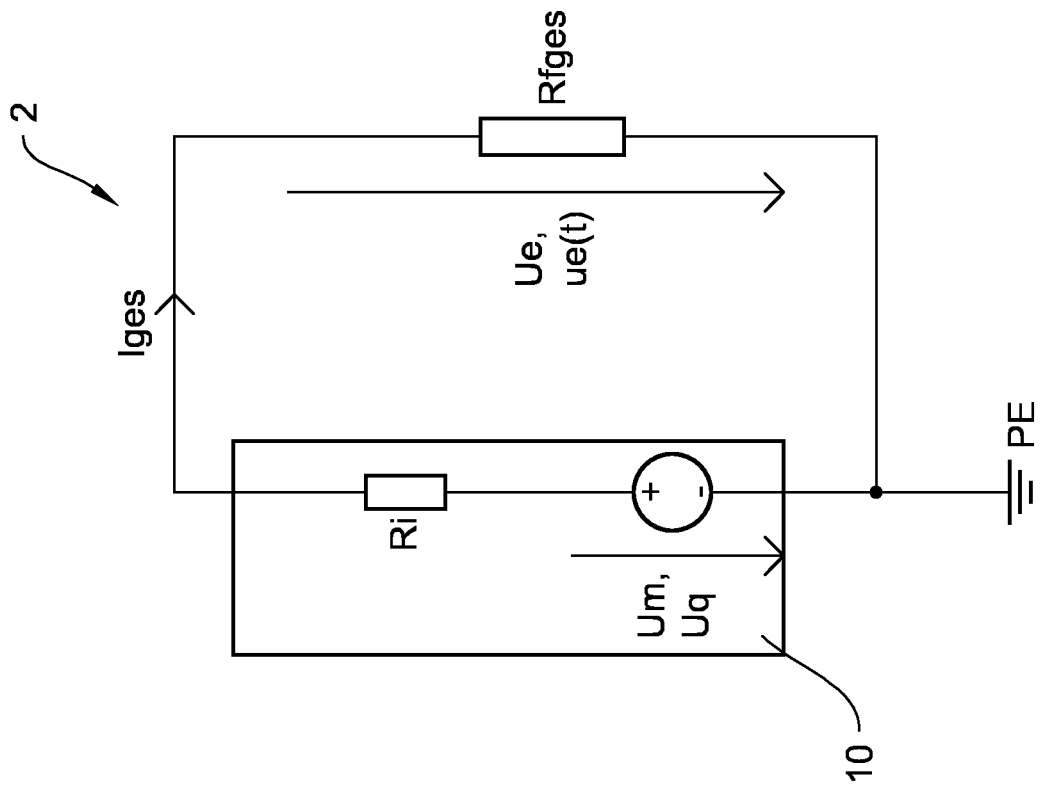
FIG. 3 shows a simplified equivalent circuit diagram of the branched ungrounded power supply system having a total insulation resistance.

FIG. 3 shows a simplified equivalent circuit diagram of branched ungrounded power supply system 2 having total insulation resistance Rfges.

All partial insulation resistances Rx of outgoing lines 4 are summarized to total insulation resistance Rfges here. Total measuring current Iges driven by known measuring alternating voltage Um—in the signal form of square pulse measuring voltage Uq—can be described via total insulation resistance Rfges provided by insulation monitoring device 10 and known inner resistance Ri of insulation monitoring device 10.

The invention claimed is:

1. A method for selectively determining a partial insulation resistance Rx of an outgoing line (4) in a branched ungrounded power supply system (2) which is monitored using an insulation monitoring device (10) which actively superposes a square pulse measuring voltage Uq on the ungrounded power supply system (2), the method comprising the following steps:
calculating partial insulation resistance Rx according to Rx=Ue/Ixstat with a stationary conductor-to-ground voltage Ue dropping via the outgoing line (4) and a stationary partial current Ixstat measured in the outgoing line (4) in a settled state,
wherein
Ue=Iges*Rfges applies to stationary conductor-to-ground voltage Ue with a total insulation resistance Rfges transmitted by the insulation monitoring device (10) and a total measuring current Iges driven by known square pulse measuring voltage Uq, wherein total measuring current Iges is calculated from Iges=Uq/(Rfges+Ri) with a known inner resistance Ri of the insulation monitoring device (10), meaning partial insulation resistance Rx is calculated from Rx=(Rfges*Uq)/((Rfges+Ri)*Ixstat).

2. A method for selectively determining a partial system leakage capacitance Cx of an outgoing line (4) in a branched ungrounded power supply system (2) which is monitored using an insulation monitoring device (10) which actively superposes a measuring alternating voltage Um on the ungrounded power supply system (2), the method comprising the following steps:
detecting a partial insulation resistance Rx of the outgoing line (4), calculating partial system leakage capacitance Cx according to Cx=ic(t)/(due(t)/dt),
with a leakage current ic(t) flowing via partial system leakage capacitance Cx and a temporal sequence of measured non-stationary conductor-to-ground voltage ue(t) which drops via the outgoing line (4) and whose temporal derivative is due(t)/dt, leakage current ic(t) being calculated from ic(t)=ix(t)−ue(t)/Rx with a temporal sequence of non-stationary partial current ix(t) measured in the outgoing line (4) and detected partial insulation resistance Rx, meaning partial system leakage capacitance Cx is calculated from Cx=(ix(t)−(ue(t)/Rx))/(due(t)/dt).

3. A monitoring device (20) for selectively determining a partial insulation resistance Rx and a partial system leakage capacitance Cx of an outgoing line (4) in a branched ungrounded power supply system (2), having an insulation monitoring device (10) which is configured to actively superpose a measuring alternating voltage Um on the power supply system (2),
wherein an AC/DC measuring current transformer (14) for measuring a stationary partial current Ixstat and a non-stationary partial current ix(t) in each outgoing line (4) to be tested,
a voltage measuring device (22) which is switched between an active conductor of the ungrounded power supply system (2) and ground (PE) for measuring the temporal sequence of non-stationary conductor-to-ground voltage ue(t), and an evaluation unit (24) which is connected to the AC/DC measuring current transformer (14) and to the insulation monitoring device (10) and is configured for calculating partial insulation resistance Rx and partial system leakage capacitance Cx.

4. The monitoring device according to claim 3, wherein the insulation monitoring device (10) is configured to superpose a square pulse measuring voltage Uq on the power supply system (2) as a measuring alternating voltage Um for calculating the partial insulation resistance Rx.

5. The monitoring device according to claim 3, wherein the measuring current transformers (14) are installed measuring current transformers (14) of an insulation fault location device (12).

6. The monitoring device according to claim 3, wherein the evaluation unit (24) is an evaluation apparatus (23) of an insulation fault location device.

* * * * *